(12) United States Patent
Jensen

(10) Patent No.: US 6,216,012 B1
(45) Date of Patent: *Apr. 10, 2001

(54) DUALBAND POWER AMPLIFIER CONTROL USING A SINGLE POWER AMPLIFIER CONTROLLER

(75) Inventor: Niels J. Jensen, Laguna Nigel, CA (US)

(73) Assignee: Conexant Systems, Inc., Newport Beach, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/965,843

(22) Filed: Nov. 7, 1997

(51) Int. Cl.$^7$ .................................................... H04B 1/38
(52) U.S. Cl. .......................... 455/553; 455/552; 455/426
(58) Field of Search .................................. 455/553, 103, 455/126, 552, 127, 84, 86, 426, 572; 330/126, 129

(56) References Cited

U.S. PATENT DOCUMENTS

| | | | |
|---|---|---|---|
| 5,126,686 | * 6/1992 | Tam | 455/126 |
| 5,261,121 | * 11/1993 | Hashimoto | 455/552 |
| 5,355,525 | * 10/1994 | Lindmayer et al. | 455/127 |
| 5,422,931 | * 6/1995 | Austin-Lazarus et al. | 455/86 |
| 5,432,473 | * 7/1995 | Mattila et al. | 455/126 |
| 5,438,684 | * 8/1995 | Schwent et al. | 455/553 |
| 5,530,923 | * 6/1996 | Heinonen et al. | 455/126 |
| 5,648,955 | * 7/1997 | Jensen et al. | 455/38.3 |
| 5,697,055 | * 12/1997 | Gilhousen et al. | 455/436 |
| 5,768,691 | * 6/1998 | Matero et al. | 455/78 |
| 5,774,017 | * 6/1998 | Adar | 330/126 |
| 5,790,587 | * 8/1998 | Smith et al. | 375/200 |
| 5,878,332 | * 3/1999 | Wang et al. | 455/103 |
| 5,884,149 | * 3/1999 | Jaakola | 455/553 |
| 5,896,562 | * 4/1999 | Heinonen | 455/86 |
| 5,915,223 | * 6/1999 | Lecuyer et al. | 455/552 |
| 6,091,966 | * 7/2000 | Meadows | 455/553 |
| 6,125,271 | * 9/2000 | Rowland, Jr. | 455/553 |

\* cited by examiner

*Primary Examiner*—Nguyen Vo
*Assistant Examiner*—Eliseo Ramos-Feliciano
(74) *Attorney, Agent, or Firm*—Thomas, Kayden, Horstemeyer & Risley, L.L.P.

(57) ABSTRACT

A system having dualband power amplifier control in a dualband phone is provided using a single power amplifier controller. The dualband phone includes two power amplifiers, where each power amplifier amplifies the power of a signal transmitted at a different frequency band. A power amplifier controller is provided for controlling the amount of amplification performed by both of the power amplifiers, and a power amplifier switching device is connected to the power amplifier controller for switching the connection of the power amplifier controller between the two power amplifiers. The system further includes a processing device which monitors the quality and strength of the received signal transmitted by various base stations in the transmission region of the dualband phone. The processing device instructs the power amplifier switching device to switch its connection between the two power amplifiers based upon a determination of which frequency band provides the optimal balance between signal quality and signal strength, and the dualband phone then transmits its signal within the selected optimal frequency band. The system measures the power of the signal transmitted from the power amplifier connected to the power amplifier controller and feeds the measured power value back to the power amplifier controller, so that the power amplifier controller may adjust the voltage driving the power amplifier connected thereto based upon any differences found between the desired power output of the connected power amplifier and the measured power output.

18 Claims, 4 Drawing Sheets

DUALBAND POWER AMPLIFIER CONTROL USING A SINGLE POWER AMPLIFIER CONTROLLER

BACKGROUND OF THE INVENTION

1. Field of the Invention

The present invention relates generally to power amplifier control of a transmitter, and specifically to power amplifier control of the transmitters of a dualband phone using a single power amplifier controller.

2. Description of Related Art

Mobile phones have recently gained widespread use throughout the world. Mobile phones communicate with a base station serving a predetermined area or cell. Each base station has a limited bandwidth within which to operate, depending upon the particular transmission technique utilized by the base station. This limited bandwidth is separated into a plurality of channels frequency-spaced evenly from one another, where these channels are used by the mobile phones within that base station's transmission area. Each base station may only handle a limited number of phones equal to the number of channels and time-slots on those channels provided by that base station. Therefore, the frequency spacing between channels is minimized in order to maximize the number of channels supported by the operating bandwidth of the base stations.

In order to prevent interference between signals on two adjacent channels, the power levels of the signals transmitted by the phones must be precisely controlled. As the mobile phones move around within a base station's cell, the power levels received at the base station will change. For instance, the power level received at the base station will increase as the phone moves closer to the base station if the signal continues to be transmitted at the same power level. Interference between adjacent channels will occur if the power level of a signal received at the base station from one of the phones is too large. Therefore, the system must constantly monitor and adjust the transmission power levels as the phones move within a base station's cell to avoid interference between channels. Most mobile phones typically have power levels between the range of 5 dBm to 33 dBm. Each phone includes a power amplifier controller (PAC) which controls a power amplifier for the transmitted signal. The PAC in each phone adjusts the transmitted power level to maintain a minimum interference between the signals received at the base station on all channels at a constant level. A certain amount of error correction is transmitted with each signal by the system, wherein the amount of error correction is predetermined based upon the constant interference level.

The capacity of base stations in highly populated areas can become saturated during time periods of high use. Mobile phones currently operate as single band phones, where the transmitted signal frequency is within the bandwidth of a base station operating on the same transmission method as the mobile phone. There is a need for mobile phones to operate with dual band transmissions to increase system capacity, so that the systems could choose between two transmission frequencies depending upon which bandwidth is less saturated and could achieve a better signal quality. A dualband phone requires two transmitters, one for each frequency band. Since the power levels of the signals transmitted by a mobile phone must be constantly adjusted, dualband mobile phones must also include a PAC for each transmitter. However, requiring two PACs in a dualband phone adds to the cost, complexity, and size of the dualband phone.

There is a need for a dualband system which selects between one of the two frequency bands to transmit a signal based upon the strength and quality of the transmitted signal received at a base station. Moreover, there is a need for a dualband phone having dualband power amplifier control using a single PAC.

OBJECTS AND SUMMARY OF THE INVENTION

It is a primary object of the present invention to overcome the aforementioned shortcomings associated with the prior art.

Another object of the present invention is to provide a dualband phone which selects between one of a plurality of frequency bands to transmit a signal based upon the strength and quality of the transmitted signal received at a base station.

Yet another object of the present invention is to provide a dualband phone having dualband power amplifier control using a single power amplifier controller to minimize the size, cost, and complexity of the dualband telephone.

These as well as additional objects and advantages of the present invention are achieved by providing a dualband phone having dualband power amplifier control using a single power amplifier controller. The dualband phone includes two power amplifiers, where each power amplifier amplifies the power of a signal transmitted at a different frequency band. A power amplifier controller is provided for controlling the amount of amplification performed by both of the power amplifiers. A power amplifier switching device is connected to the power amplifier controller for switching the connection of the power amplifier controller between the two power amplifiers, so that only one of the two power amplifiers is connected to the power amplifier controller at one time. The dualband phone further includes a processing device which monitors the quality and strength of the received signal transmitted by various base stations in the transmission region of the dualband phone. The processing device instructs the power amplifier switching device to switch its connection between the two power amplifiers based upon a determination of which frequency band provides the optimal balance between signal quality and signal strength, and the dualband phone then transmits within the selected frequency band.

The processing device includes a stored predetermined relationship between signal strength and a voltage driving the power amplifiers, where the processing device instructs the power amplifier controller to adjust the voltage driving the connected power amplifier according to the desired signal strength. The dualband phone monitors the quality and strength of the received signal during each duty cycle and the system selects which one of the two power amplifiers should be connected to the power amplifier controller for each duty cycle.

The dualband phone also includes a pair of power detectors attached to the output of the power amplifiers, respectively, where the power detectors measure the power of the signal transmitted from the connected power amplifier. The measured power of the transmitted signal is fed back to the power amplifier controller, wherein a feedback switching device selectively connects one of the two power detectors to the power amplifier controller. The feedback switching device operates in conjunction with the power amplifier switching device so that the power detector associated with the power amplifier connected to the power amplifier controller is also connected to the power amplifier controller. The power amplifier controller adjusts the voltage driving the power amplifier connected thereto based upon a difference between the desired power output by the connected power amplifier and the measured power of the signal output by the connected power.

The dualband phone further includes a transmitting antenna connected to the outputs of the power amplifiers. Directional couplers are positioned between the transmitting antenna and respective power detectors in order to prevent any signals incidentally reflected back from the transmitting antenna from entering either power detector. Thus, the measured output power signal fed back to the power amplifier controller will not include any extraneous values reflected from the transmitting antenna. In an alternative embodiment where the power amplifiers are current driven, the dualband phone may further include a voltage-to-current amplifier positioned between the power amplifier controller and the power amplifier switching device in order to convert the voltage control signal from the power amplifier controller to a current control signal.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings in which the reference numerals designate like parts throughout the figures thereof and wherein:

DETAILED DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the general principles of the present invention have been defined herein specifically to provide a system for providing dualband power amplifier control in a dualband telephone using a single power amplifier controller.

Figure 1:
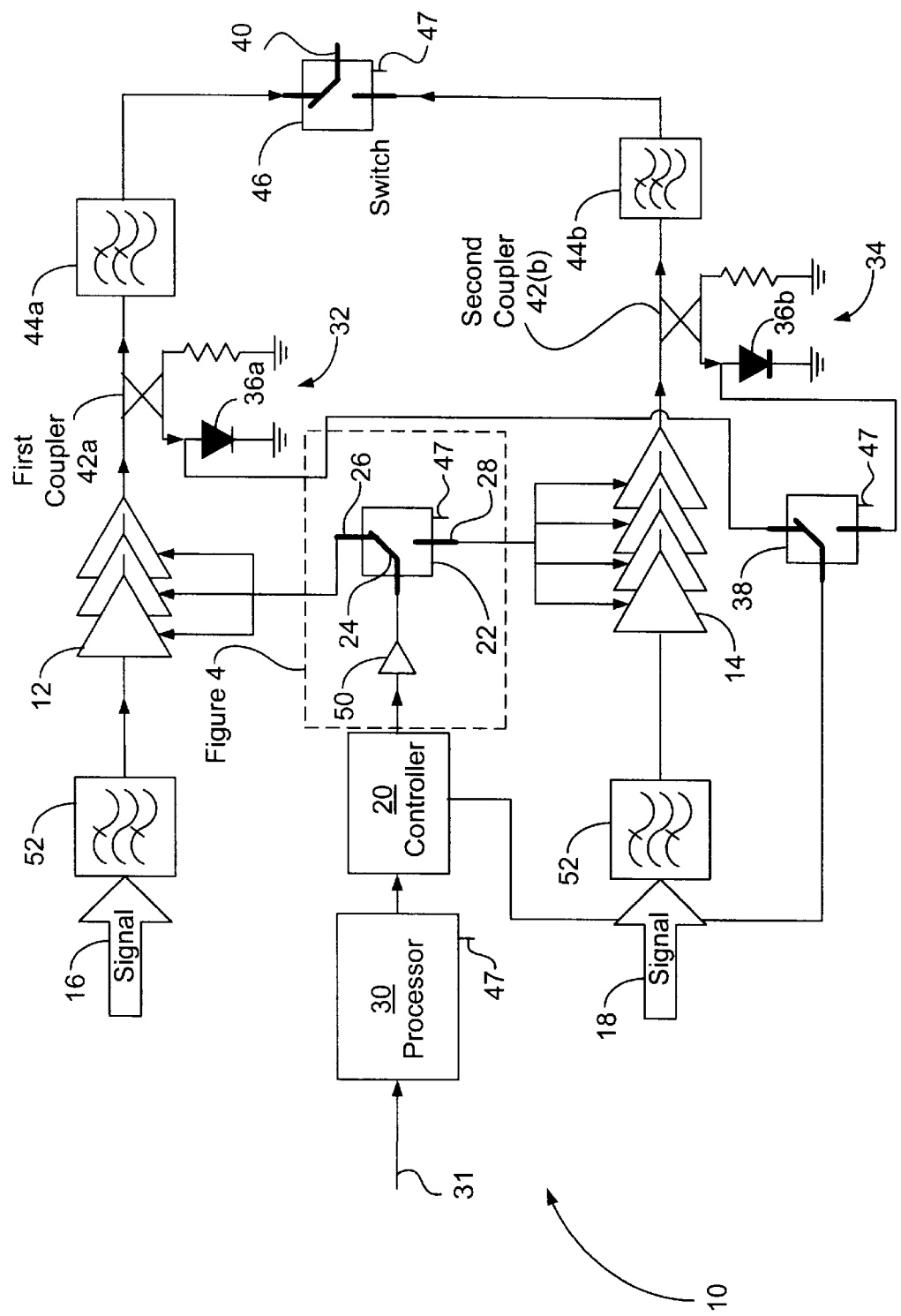
FIG. 1 is a schematic illustration of a preferred embodiment of a system for controlling the power of signal transmitted from a dualband phone in accordance with a preferred embodiment of the present invention.

Referring now to FIG. 1, a schematic illustration of the system 10 for controlling the power of a signal transmitted from a dualband phone of the present invention is shown. The dualband power amplifier control system 10 of the present invention will be described hereinafter for use in controlling the transmitters in a dualband phone. However, it is understood that the dualband power amplifier control system 10 may be implemented in any similar device which transmits information from a mobile device to a base station, such as mobile modems or mobile fax machines.

The dualband power amplifier control system 10 includes two power amplifiers 12 and 14, where power amplifier 12 amplifies the power of a signal 16 to be transmitted at a first frequency band while power amplifier 14 amplifies the power of signal 18 to be transmitted at a second different frequency band. A power amplifier controller 20 is provided for controlling the amount of amplification performed by power amplifiers 12 and 14. A power amplifier switching device 22 is connected to the power amplifier controller 20 for switching the connection of the power amplifier controller 20 between power amplifiers 12 and 14. Switching device 22 includes a switch 24 and electrical contacts 26 and 28, which are respectively connected to power amplifiers 12 and 14. Therefore, only one of the two power amplifiers 12 and 14 is connected to the power amplifier controller 20 at one time, depending upon the position of switch 24. Switching device 22 may comprise any type of multiple-contact switch that allows its connection between the contacts to be easily switched.

The dualband power amplifier control system 10 further includes a processing device 30 which monitors the quality and strength of the received signal 31 transmitted from various base stations within the transmission region of the dualband phone. Processing device 30 may comprise a microprocessor, IC chip, or other similar device used for processing information. The base stations also monitor the quality and strength of the signals they receive from the various dualband phones. The processing device 30 determines which frequency band and which base station provides the optimal balance between signal quality and signal strength. When processing device 30 determines that the optimal frequency band or optimal base station is not currently being used, the dualband phone transmits a request to the base station with which it is communicating to change frequency bands or base stations. The base station will then instruct processing device 30 to change its transmission to the optimal frequency band or optimal base station. The processing device 30 then instructs the switching device 22 to switch its connection between the two power amplifiers 12 and 14 based upon a determination of which frequency band provides the optimal balance between signal quality and signal strength. The determination of which frequency band provides the optimal balance between signal quality and signal strength may be determined by the processing device 30 itself from information received from the base stations or may be made by base stations themselves.

The processing device 30 includes a stored predetermined relationship between transmitted signal strength and a voltage driving power amplifiers 12 and 14, where the processing device 30 instructs the power amplifier controller 20 to adjust the voltage driving the connected power amplifier according to the desired signal strength. The power level is precisely controlled to provide a high quality signal without interfering with other channels at the receiving base station. The dualband phone monitors the quality and strength of the received signal for each duty cycle and on command by the base station selects which of the two power amplifiers 12 and 14 should be connected to the power amplifier controller 20 for each duty cycle. For instance, during transmission of a digital signal by a telephone, active transmission only occurs 12.5% of the time with a typical transmission time of 577 $\mu s$. During the inactive period, the telephone has a receiving period and monitoring period where the dualband phone measures the various signal strengths and signal qualities of the transmitted signal received from the various base stations. For each cycle, the signal quality and signal strength from the various base stations is analyzed to determine which base station to transmit to and at which frequency band to transmit. By performing this determination for each duty cycle, optimal transmission of the signal from the telephone is maintained at all times.

The dualband phone also includes a first power detector 32 attached to the output of power amplifier 12, while a second power detector 34 is attached to the output of power amplifier 14. Power detectors 32 and 34 measure the actual power of the signal transmitted from the connected power amplifier. In the preferred embodiment of the present invention, power detectors 32 and 34 are formed from a diode/resistor pair, where the diodes 36a and 36b are used to measure the power of the transmitted signal. However, it is understood that any device which measures the power of a transmitted signal may be used as power detectors 32 and 34. Alternatively, a single broadband power detector connected to the output of both power amplifiers 12 and 14 may be used in place of power detectors 32 and 34. The power of the transmitted signal measured by power detectors 32 and 34 is fed back to the power amplifier controller 20 in order to provide precise control of the actual power of the signal transmitted from dualband power amplifier control system 10. As previously described, the power of the transmitted signal must be precisely controlled to avoid interference between channels of a base station. Therefore, it is important to monitor the actual power of the signal transmitted to determine if it varies from the desired transmission power.

In order to connect the power amplifier controller 20 to the proper one of the power detectors 32 and 34 measuring the power of the transmitted signal, a feedback switching device 38 is connected to both power detectors 32 and 34. Feedback switching device 38, similar to power amplifier switching device 22, selectively connects one of the power detectors 32 and 34 to the power amplifier controller 20 in conjunction with switching device 22. Thus, power detector 32 and power amplifier 12 are connected to power amplifier controller 20 at the same time, while power detector 34 is connected to power amplifier controller 20 at the same time as power amplifier 14. The power amplifier controller 20 adjusts the voltage driving the power amplifier connected thereto based upon any differences found between the desired power output by the connected power amplifier and the power of the transmitted signal as measured by power detectors 32 and 34. This enables power amplifier controller 20 to account for variations which may occur in the power amplification procedure of the transmitted signals, such as those variations occurring in the components of the dualband phone as affected by temperature, battery voltage, etc.

A transmitting antenna 40 is connected to the outputs of power amplifiers 12 and 14 for transmitting the amplified signal to the various base stations. Directional couplers 42a and 42b are positioned between the transmitting antenna 40 and power detectors 32 and 34, respectively, in order to prevent any signals reflected back from said transmitting antenna from entering power detectors 32 and 34. If any error occurs during the transmission of the signal by a defect in transmitting antenna 40, a portion of the signal may be reflected back from the transmitting antenna toward power detectors 32 and 34. Thus, directional couplers 42a and 42b prevent the measured power of the transmitted signal which is fed back to power amplifier controller 20 from including any extraneous values from signals reflected back from transmitting antenna 40. This enables more precise control of the power of the signal to be transmitted by providing an accurate value of the measured power of the transmitted signal back to the power amplifier controller. Lowpass filters 44a and 44b are also positioned between the transmitting antenna 40 and the outputs of power amplifiers 12 and 14, respectively. Lowpass filters 44a and 44b only allow signals transmitted at a predetermined frequency to pass there through, where lowpass filter 44a is frequency matched with the signal amplified by power amplifier 12 while lowpass filter 44b is frequency matched with the signal amplified by power amplifier 14.

In the preferred embodiment of the present invention, an antenna switching device 46 is attached between transmitting antenna 40 and the outputs of power amplifiers 12 and 14 in order to control which power amplifier is attached to transmitting antenna 40. Antenna switching device 46 operates similarly as power amplifier switching device 22 and also operates in conjunction with power amplifier switching device 22 and feedback switching device 38, so that transmitting antenna 40 is connected with the output of the power amplifier selectively connected to power amplifier controller 20 by power amplifier switching device 22.

Figure 2:
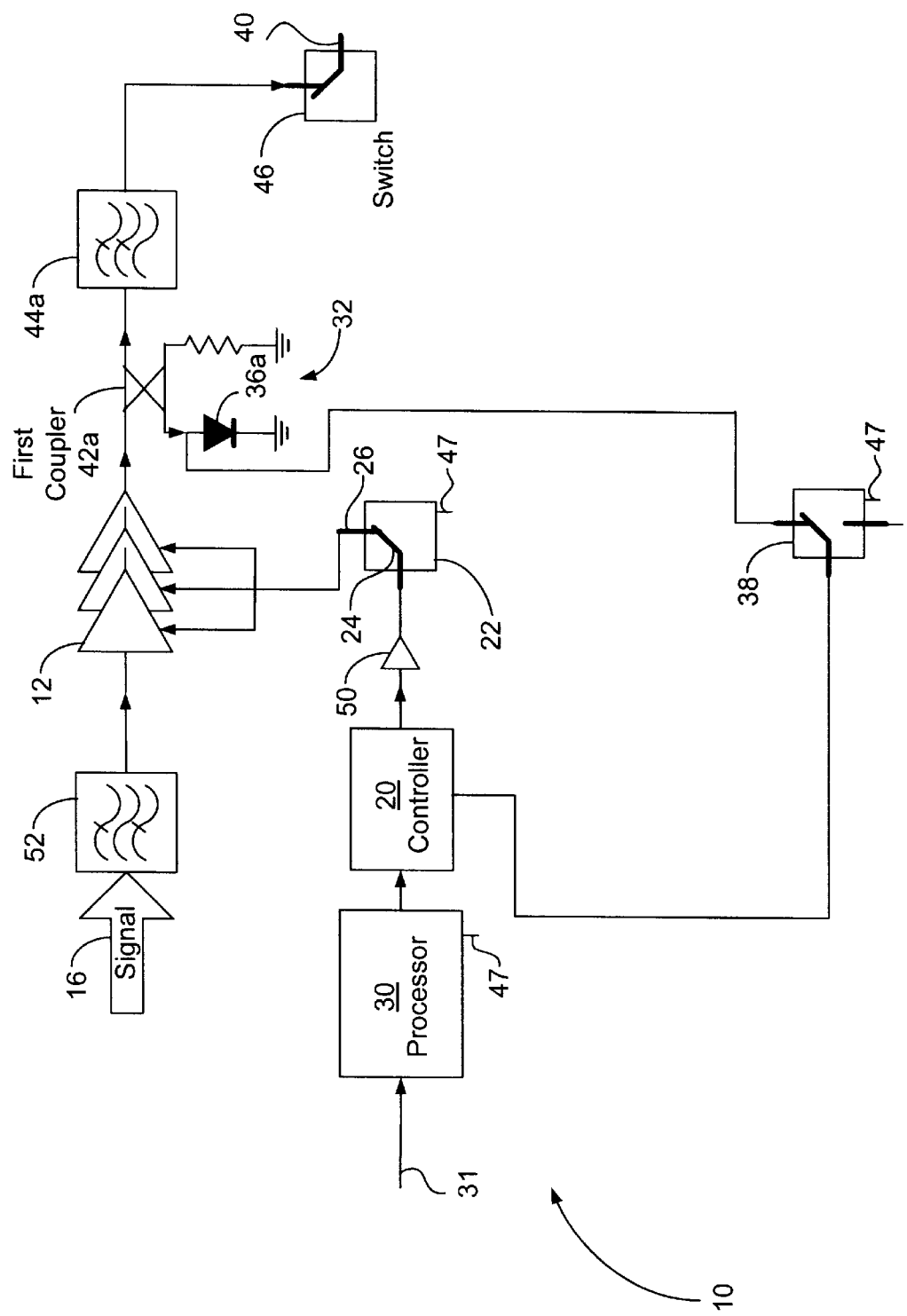
FIG. 2 is a schematic illustration of the components of FIG. 1 involved in controlling the power of signal transmitted at a first frequency band of the dualband phone.
Figure 3:
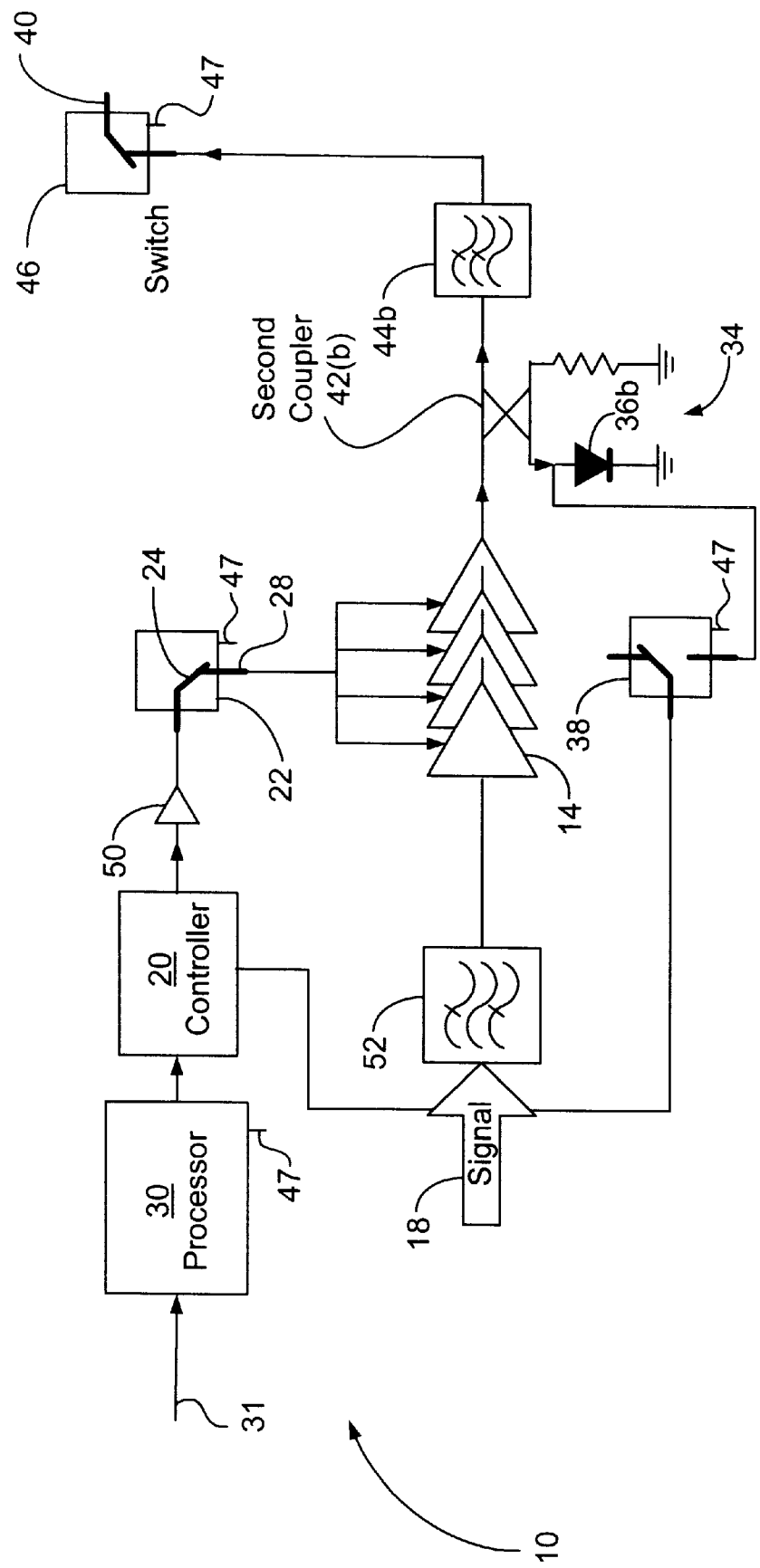
FIG. 3 is a schematic illustration of the components of FIG. 1 involved in controlling the power of a signal transmitted at a second frequency band of the dualband phone.
Figure 4:
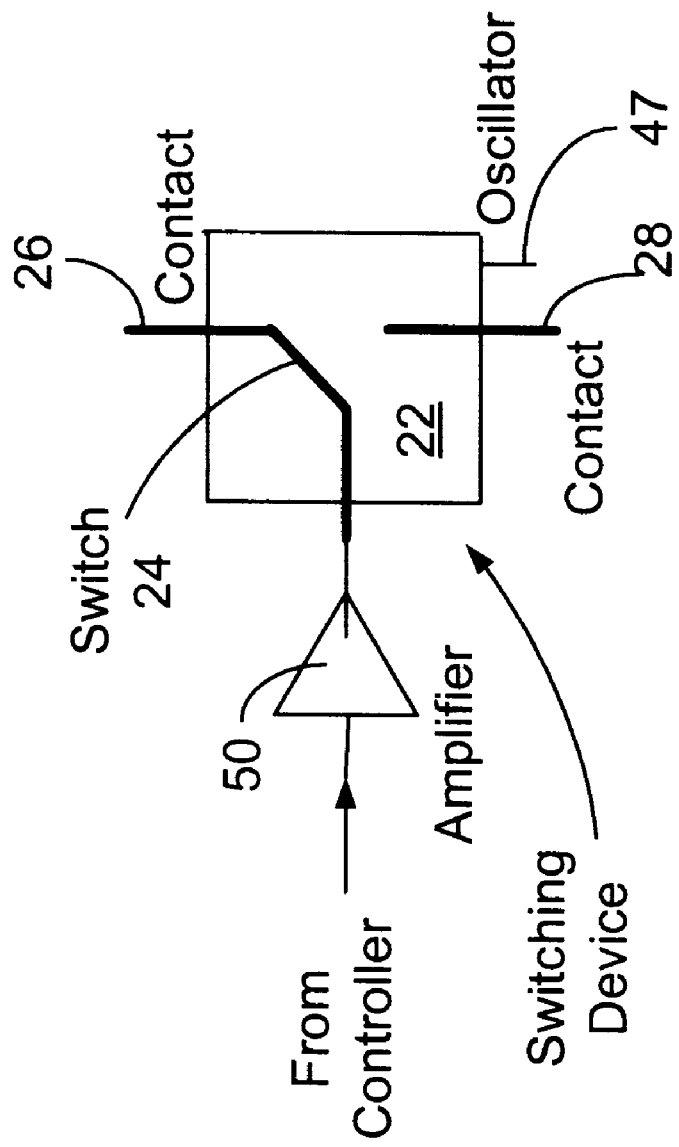
FIG. 4 is a schematic illustration of the operational amplifier and switching device of FIG. 1.

Processing device 30 controls switching devices 22, 38, and 46 in conjunction with a command by voltage-controlled oscillator (VCO) 47 so that all of the components of the dualband phone are alternatively connected to either power amplifier 12 or power amplifier 14. FIG. 2 illustrates the components of the present invention in the transmission loop when power amplifier 12 is connected to power amplifier controller 20 in order to amplify a signal to be transmitted at a first frequency band, while FIG. 3 illustrates the components of the present invention in the transmission loop when power amplifier 14 is connected to power amplifier controller 20 in order to amplify a signal to be transmitted at a second frequency band.

In an alternative embodiment of the present invention, antenna switching device 46 may be omitted from the dualband power amplifier control system 10, where transmitting antenna 40 is simultaneously connected to the outputs of both power amplifiers 12 and 14. Since processing device 30 instructs the dualband band transmitter 10 to transmit only one frequency band at a time, only one of the power amplifiers 12 and 14 will output a signal to be transmitted during each duty cycle. Further, lowpass filters 44a and 44b will prevent unwanted signals output by the power amplifiers 12 and 14 from being radiated by the antenna 40.

In the embodiment of the present invention illustrated in FIGS. 1–4, a voltage-to-current amplifier 50 is positioned between power amplifier controller 20 and switching device 22 in order to drive power amplifiers 12 and 14, which are current driven devices. Since most power amplifier controllers 20 can only control voltage controlled devices, voltage-to-current amplifier 50 is used to convert the voltage control signal from power amplifier controller 20 to a current control signal to be sent to power amplifiers 12 and 14. However, it is understood that voltage-to-current amplifier 50 may be omitted from the present invention in those situations where power amplifiers 12 and 14 are voltage driven, so that power amplifier controller 20 is directly connected to the power amplifier switching device 22.

The implementation of the present invention will now be described with reference to particular transmission systems. This example is described merely for the purpose of illustration and does not encompass all possible types of transmission methods which may be used with the dualband power amplifier control system 10 of the present invention.

EXAMPLE 1

There are many types of transmission techniques currently being used for mobile telephones, where such digital transmission techniques include GSM (Global System of Mobile Communications) 900 and GSM 1800. GSM 900 operates at a frequency band of 900 MHz, while GSM 1800 operates at a frequency band of 1800 MHz. The dualband phone of the present invention could be designed to operate at both GSM 900 and GSM 1800 frequency bands. GSM 1800 has a bandwidth of 75 MHz as compared to 25 MHz for GSM 900, so that a GSM 1800 base station has three times the capacity of usable channels than GSM 900. However, the transmission distance of a GSM 1800 signal is much smaller than that of GSM 900, because the transmission frequency of GSM 1800 is twice that of GSM 900 and the power of the GSM 1800 transmitted signal is half that of GSM 900. Thus, a GSM 1800 base station covers a much smaller area than that of a GSM 900 base station.

Processing device 30 receives signals from the base stations of both GSM 900 and GSM 1800 systems in communication range with the dualband phone, where processing device 30 decides whether to transmit to a GSM 900 or GSM 1800 signal based upon the information about signal quality and strength it receives from the various base stations. In the situation where power amplifier 12 is designed to amplify a GSM 900 transmitted signal while power amplifier 14 is designed to amplify a GSM 1800 transmitted signal, the components of the present invention as illustrated in FIG. 2 would be interconnected when processing device 30 decided to transmit a GSM 900 signal. Processing device 30 would instruct switching devices 22, 38, and 46 to establish their connections associated with power amplifier 12. A modulated signal 16, such as a Gaussian minimum shift-keying (GMSK) signal, would be fed through filter 52 and into power amplifier 12. Processing device 30 would instruct power amplifier controller 20 to control power amplifier 12 to amplify the power of signal 16 to the desired level for the base station communicated with the dualband telephone. The amplified signal 16 exiting power amplifier 12 is fed through lowpass filter 44a to transmitting antenna 40 for transmission. Directional coupler 42a branches off a portion of the signal 16 output by power amplifier 12 to power detector 32, where the actual power of the signal transmitted is measured across diode 36a. The measured power is fed back through feedback switching device 38 to power amplifier controller 20, so that the power level of the amplified signal may be adjusted for any variations detected between the measured power and desired power of the transmitted signal.

During the next duty cycle, if processing device 30 determines that a GSM 1800 transmitted signal would provide a more optimal balance between signal strength and signal quality, then switching devices 22, 38, and 46 are switched as shown in FIG. 3 to establish their connection associated with power amplifier 14 to transmit a GSM 1800 signal during the next transmission period.

As can be seen from the foregoing, a dualband phone having dualband power amplifier control using a single power amplifier controller formed in accordance with the present invention allows an optimal frequency band to be selected from a plurality of frequency bands as the transmission frequency for the transmitted signal based upon the strength and quality of the signal received at a base station. Moreover, by forming a dualband phone having dualband power amplifier control using a single power amplifier controller in accordance with the present invention, the size, cost, and complexity of the dualband telephone can be minimized by reducing the number of components required to transmit a signal at two possible frequency bands.

In each of the above embodiments, the structures of the system for controlling the power of signal transmitted from a dualband transmitter using a single power amplifier controller system of the present invention are described separately in each of the embodiments. However, it is the full intention of the inventors of the present invention that the separate aspects of each embodiment described herein may be combined with the other embodiments described herein. Those skilled in the art will appreciate that various adaptations and modifications of the just-described preferred embodiment can be configured without departing from the scope and spirit of the invention. For instance, while the present invention has been described for use in a dualband telephone, it is understood that the dualband power amplifier control system 10 of the present invention could be modified to handle any number of frequency bands by incorporating additional power amplifiers and switching devices capable of selecting between a plurality of connections. Therefore, it is to be understood that, within the scope of the appended claims, the invention may be practiced other than as specifically described herein.

What is claimed is:

1. A dualband phone having dualband amplifier control using a single power amplifier controller, comprising:

a first power amplifier for amplifying the power of a signal transmitted at a first frequency band;

a second power amplifier for amplifying the power of a signal transmitted at a second frequency band;

a power amplifier controller for controlling the amount of amplification performed by one of said first and second power amplifier;

a single switch connected to said power amplifier controller for switching the connection of said power amplifier controller between said first and second power amplifier; and a processing means for monitoring the quality and strength of a received signal from a base station and instructing said switch to switch its connection between said first and second power amplifier based upon a determination of which of said first and second frequency bands provides an optimal balance between signal quality and signal strength.

2. The dualband phone of claim 1, wherein said processing means includes a stored predetermined relationship between signal strength and a voltage driving said first and second power amplifiers; said processing means further instructing said power amplifier controller to adjust the voltage driving said first and second power amplifiers according to a desired signal strength.

3. The dualband phone of claim 1, wherein said processing means monitors the quality and strength of the received signal for each duty cycle of the phone and instructs said single switch which of said first and second power amplifier to connect to said amplifier controller for each duty cycle.

4. The dualband phone of claim 1, further comprising:

a first power measuring means for measuring the power of the signal transmitted from said first power amplifier;

a second power measuring means for measuring the power of the signal transmitted from said second power amplifier; and a feedback switching means for selectively connecting one of said first and second power measuring means to said power amplifier controller;

wherein said feedback switching means operates in conjunction with said single switch so that said first power measuring means is connected to said power amplifier controller when said power amplifier controller is connected to said first power amplifier and said second power measuring means is connected to said power amplifier controller when said power amplifier controller is connected to said second power amplifier.

5. The dualband phone of claim 4, wherein said power amplifier controller adjust the voltage driving the power amplifier connected thereto based upon a difference between a desired power output and the power measured by one of said first and second power measuring means.

6. The dualband phone of claim 4, further comprising:
a transmitting antenna connected to the outputs from said first and second power amplifiers;
a first directional coupler positioned between said transmitting antenna and said first power measuring means; and
a second directional coupler positioned between said transmitting antenna and said second power measuring means;
wherein said first and second directional couplers prevent any signals reflected back from said transmitting antenna from entering said first and second power measuring means, respectively.

7. The dualband phone of claim 1, further comprising a voltage-to-current amplifier positioned between said power amplifier controller and said single switch when said first and second power amplifiers are current driven.

8. A method for controlling the power of a signal transmitted from a dualband telephone to a base station, comprising the steps of:
monitoring the quality and strength of signals received at the dualband telephone from the base station and at the base station from the dualband telephone;
determining which frequency band of the dualband telephone will provide the optimal balance between signal quality and signal strength while transmitting the signal to the base station based upon the quality and strength of the signals received by at least one of the dualband phone and the base station;
switching the connection of a power amplifier controller to one of a first power amplifier amplifying the power of signal transmitted at a first frequency band and a second power amplifier amplifying the power of a signal transmitted a second frequency band, wherein the connection is switched depending upon which frequency band will provide the optimal balance between signal quality and signal strength;
controlling the amount of amplification performed by the connected one of said first power amplifier and said second power amplifier based upon a desired signal strength.

9. The method for controlling the power of a signal transmitted from a dualband telephone of claim 8, wherein the amount of amplification performed is controlled by adjusting a voltage driving said first and second power amplifiers according to the desired signal strength.

10. The method for controlling the power of a signal transmitted from a dualband telephone of claim 8, wherein the quality and strength of the received signals is monitored during each duty cycle of the received signals and the connection between said power amplifier controller and one of said first power amplifier and said second power amplifier is determined for each duty cycle.

11. The method for controlling the power of a signal transmitted from a dualband telephone of claim 8, further comprising the steps of:
measuring the power of the signal transmitted from the connected one of said first power amplifier and said second power amplifier;
delivering the measured power of the transmitted signal back to said power amplifier controller; and
adjusting the voltage driving the selected power amplifier based upon a difference between the desired power output of the selected power amplifier and the measured power of the transmitted signal fed back to said power amplifier controller.

12. A system for controlling the power of a signal transmitted from a multiband transmitter, comprising:
a plurality of power amplifiers for amplifying the power of a signal transmitted at a plurality of frequency bands; wherein each of said plurality of power amplifiers amplifies the power of a signal transmitted at a different frequency band;
a power amplifier controller for controlling the amount of amplification performed by one of said plurality of power amplifiers;
a single switch connected to said power amplifier controller for switching the connection of said power amplifier controller between said plurality of power amplifiers; and
a processing means for monitoring the quality and strength of a received signal from a base station and instructing said single switch to switch its connection between said plurality of power amplifiers based upon a determination of which of said plurality of frequency bands provides an optimal balance between signal quality and signal strength.

13. The system for controlling the power of a signal transmitted from a multiband transmitter of claim 12, wherein said processing means includes a stored predetermined relationship between signal strength and a voltage driving said plurality of power amplifiers; said processing means further instructing said power amplifier controller to adjust the voltage driving said plurality of power amplifiers according to the desired signal strength.

14. The system for controlling the power of a signal transmitted from a multiband transmitter of claim 12, wherein said processing means monitors the quality and strength of the received signal for each duty cycle of the received signal and instructs said single switch which of said plurality of power amplifiers to connect to said power amplifier controller for each duty cycle.

15. The system for controlling the power of a signal transmitted from a multiband transmitter of claim 12, further comprising:
a plurality of power measuring means for measuring the power of the signal transmitted from said plurality of power amplifiers; wherein each one of said plurality of power amplifiers is associated with a respective one of said plurality of power measuring means; and
a feedback switching means for selectively connecting one of said plurality of power measuring means to said power amplifier controller;
wherein said feedback switching means operates in conjunction with said single switch so that a respective one of said plurality of power measuring means is connected to said power amplifier controller along with its associated one of said plurality of power amplifiers.

16. The system for controlling the power of a signal transmitted from a multiband transmitter of claim 15, wherein said power amplifier controller adjust the voltage driving the power amplifier connected thereto based upon a difference between a desired power output and the power measured by one of said plurality of power measuring means.

17. The system for controlling the power of a signal transmitted from a multiband transmitter of claim 15, further comprising:
- a transmitting antenna connected to the outputs from said plurality of power amplifiers; and
- a plurality of directional couplers positioned between said transmitting antenna and said plurality of power measuring means; wherein each one of said plurality of directional couplers is associated with a respective one of said power measuring means;

wherein said plurality of directional couplers prevent any signals reflected back from said transmitting antenna from entering said plurality of power measuring means, respectively.

18. The system for controlling the power of a signal transmitted from a multiband transmitter of claim 12, further comprising a voltage-to-current amplifier positioned between said power amplifier controller and said single switch when said power amplifiers are current driven.

\* \* \* \* \*